United States Patent
Tsumura

(10) Patent No.: US 8,902,645 B2
(45) Date of Patent: Dec. 2, 2014

(54) SEMICONDUCTOR MEMORY CIRCUIT

(71) Applicant: Seiko Instruments Inc., Chiba (JP)

(72) Inventor: Kazuhiro Tsumura, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 14/033,926

(22) Filed: Sep. 23, 2013

(65) Prior Publication Data

US 2014/0085987 A1 Mar. 27, 2014

(30) Foreign Application Priority Data

Sep. 27, 2012 (JP) ................... 2012-215035

(51) Int. Cl.
*G11C 16/04* (2006.01)
*G11C 16/12* (2006.01)
*G11C 16/06* (2006.01)
*G11C 16/24* (2006.01)

(52) U.S. Cl.
CPC ............... *G11C 16/24* (2013.01); *G11C 16/12* (2013.01); *G11C 16/06* (2013.01)
USPC ............. 365/185.01; 365/185.08; 365/185.18

(58) Field of Classification Search
USPC .................................................... 365/185.01
See application file for complete search history.

(56) References Cited

U.S. PATENT DOCUMENTS

2010/0046298 A1* 2/2010 Tsumura ................... 365/185.18

OTHER PUBLICATIONS

Patent Abstracts of Japan, Publication No. 07-122090, Publication Date May 12, 1995.
Patent Abstracts of Japan, Publication No. 2003-257186, Publication Date Sep. 12, 2003.

* cited by examiner

*Primary Examiner* — Son Mai
(74) *Attorney, Agent, or Firm* — Adams & Wilks

(57) ABSTRACT

Provided is a semiconductor memory circuit excellent in long-term reliability and reading characteristics and having low current consumption. The semiconductor memory circuit includes: a first inverter; a first non-volatile memory, which is electrically writable; a second inverter; and a second non-volatile memory, the first inverter having an output connected to a source of the first non-volatile memory, the first non-volatile memory having a drain connected to an input of the second inverter, the second inverter having an output connected to a source of the second non-volatile memory, the second non-volatile memory having a drain connected to an input of the first inverter, the drain of the second non-volatile memory serving as an output of the semiconductor memory circuit.

7 Claims, 12 Drawing Sheets

SEMICONDUCTOR MEMORY CIRCUIT

BACKGROUND OF THE INVENTION

1. Field of the Invention

The present invention relates to a semiconductor memory circuit including a non-volatile memory.

2. Description of the Related Art

Some semiconductor circuit devices have a resistor voltage divider circuit for adjustment. Commonly-used examples include a voltage detection circuit device generally called "voltage detector". The voltage detection circuit device is made up of a reference voltage, an amplifier, a resistor voltage divider circuit, and an output transistor, and is configured to output "High" or "Low" depending on whether a voltage is higher or lower than a predetermined detection voltage value. When the circuit is manufactured by a semiconductor wafer process, the reference voltage fluctuates because of fluctuations in the manufacturing process. To deal with this problem, the resistor voltage divider circuit is designed to have an arbitrary voltage dividing ratio by adjustment so that the detection voltage value can be set to a constant value. Since the detection voltage value can be controlled by controlling the voltage dividing ratio of the resistor voltage divider circuit, it is advantageous for obtaining an arbitrary detection voltage value easily.

A widely-used method for adjusting the voltage dividing ratio of the resistor voltage divider circuit is a trimming fuse. A fuse is arranged in parallel to each of a large number of resistors constituting the resistor voltage divider circuit, and trimming is performed by cutting the fuse by laser. The resistor connected in parallel to an uncut fuse does not function as a resistor because the fuse is short-circuited. The resistor connected in parallel to a cut fuse functions as a resistor because the fuse is cut, that is, the fuse is in the OPEN state.

As another method, an electrically writable EPROM is often used. A transistor is arranged in parallel to a resistor, and trimming is performed by turning ON or OFF the parallel-arranged transistor based on information stored in the EPROM. The EPROM is advantageous in that electrical writing is possible even after the assembly into a package or onto a board. In the case of the fuse, the trimming needs to be performed before the package assembly because laser irradiation is necessary.

Next, a further description is given of the EPROM. There are various types of EPROMs, but a commonly-used one employs a MOS transistor structure having a floating gate, which stores data of 1 or 0 by utilizing a phenomenon that a threshold voltage VT changes depending on electric charges accumulated in the floating gate. In the following, the EPROM refers to this structure.

Typical requirements for the use of the EPROM include being low in current consumption, free from data corruption, and small in circuit area.

In many cases, data is written into the EPROM by utilizing so-called hot-carrier injection, which is the phenomenon that electric charges flowing between a source and a drain become hot carriers when a high voltage is applied between the source and the drain. The feature of this writing method resides in that the high voltage is applied between the source and the drain.

In this method, if a certain level of voltage is applied to the drain at the time of reading or holding data, data may be written also in the reading or holding of data. To deal with this problem, the measure as disclosed in Japanese Patent Application Laid-open No. H07-122090 has been proposed. The feature resides in that a voltage is applied to the EPROM to cause a current to flow for a moment so as to read data, and the data is stored in a latch circuit. Because the latch circuit continues to store the data in a period during which the power source is turned ON, it is possible to apply the voltage to the EPROM only upon turning ON the power source and not to apply the voltage thereafter. Consequently, the chance of corruption of the stored data of the EPROM can be reduced to improve the reliability.

Next, an introduction is given to Japanese Patent Application Laid-open No. 2003-257186. As disclosed therein, two EPROMs are arranged in series and configured so that one of the EPROMs is turned ON while the other is turned OFF. No current flows between power sources because one of the EPROMs is turned OFF. The circuit configuration is simple as compared with Japanese Patent Application Laid-open No. H07-122090, and results in a merit of a small occupation area.

The method described in Japanese Patent Application Laid-open No. H07-122090 and illustrated in FIG. 17 as a conventional example has the problem in reading data to the latch circuit. As described in Japanese Patent Application Laid-open No. 2003-257186, the problem occurs particularly in reading immediately after a power supply voltage is turned ON. When the method is applied to the voltage detector described in the "Description of the Related Art" section, the problem is particularly liable to occur because a terminal for the power supply voltage and a terminal for detecting a voltage are shared in many cases and the power supply voltage itself is unstable.

Japanese Patent Application Laid-open No. 2003-257186 can avoid the problem relating to the latch circuit, but has a problem in that a drain voltage of one of the EPROMs becomes higher and hence a small degree of writing proceeds little by little to cause corruption of data of the EPROM.

It is apparent for the voltage detector to desirably have a wide allowable range of the detection voltage. For example, in the case of a voltage detector designed to switch the output between 1 and 0 at a detection voltage of 5 V, the product competitive power is higher when a voltage allowed to be applied to the detection terminal is 1 V to 10 V than 4 V to 6 V. Because the power supply voltage terminal and the voltage detection terminal are often shared as described above, it is required to have a wide allowable range of the power supply voltage. Accordingly, it is required to be free from data corruption even at a high power supply voltage. In the method of Japanese Patent Application Laid-open No. 2003-257186, the problem of data corruption of the EPROM becomes conspicuous because the electric charges are easily injected into the floating gate of the turned-OFF EPROM as the power supply voltage becomes higher.

The trimming circuit using the EPROM is used in some fields today, but is not used in other fields because of the above-mentioned problem.

SUMMARY OF THE INVENTION

In order to solve the above-mentioned problem, according to one embodiment of the present invention, a resistor voltage divider circuit employs the following configuration.

That is, there is provided a semiconductor memory circuit, including: a first inverter; a first non-volatile memory, which is electrically writable; a second inverter; and a second non-volatile memory, the first inverter having an output connected to a source of the first non-volatile memory, the first non-volatile memory having a drain connected to an input of the second inverter, the second inverter having an output connected to a source of the second non-volatile memory, the second non-volatile memory having a drain connected to an input of the first inverter, the drain of the second non-volatile memory serving as an output of the semiconductor memory circuit.

According to the semiconductor memory circuit of the one embodiment of the present invention, current consumption is very small because only a leakage current is consumed in reading. In reading, a relatively large voltage is applied between the source and the drain of the EPROM only in a so-called transient state, that is, upon the accumulation of electric charges in a downstream gate and in other parasitic capacitances or upon the discharge of the accumulated electric charges. Because the application of the voltage to the EPROM is automatically stopped after the transient state, it is not necessary to additionally control the voltage applied to the EPROM. Besides, the effect that stored information can be prevented from being erroneously written even after the continuous use in the reading state can be obtained.

DETAILED DESCRIPTION OF THE PREFERRED EMBODIMENTS

Referring to the accompanying drawings, embodiments of the present invention are described below.

First Embodiment

Figure 1:
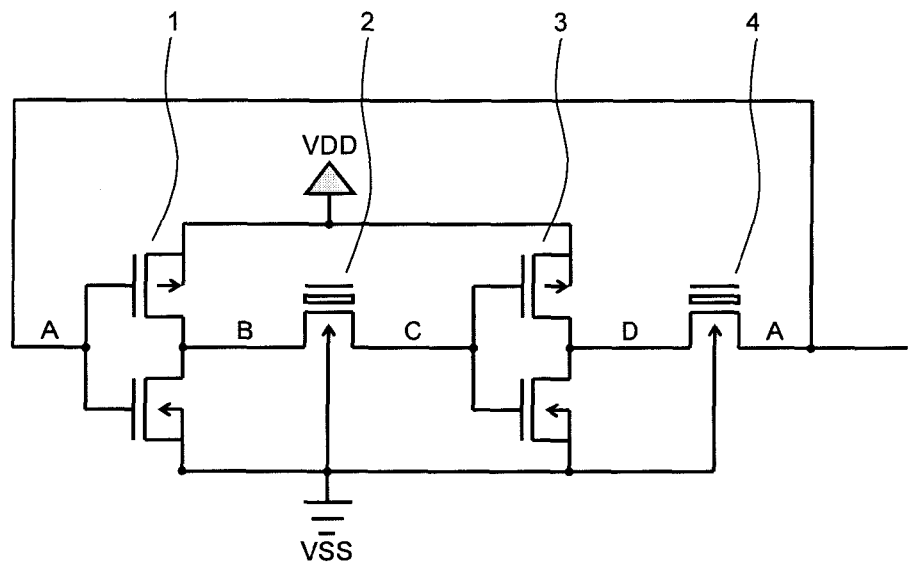
FIG. 1 is a semiconductor memory circuit of the present invention.

FIG. 1 is a basic circuit of the present invention. This circuit is a semiconductor memory circuit in which an output B of a first inverter 1 is connected to a source of a first EPROM 2, a drain C of the first EPROM is connected to an input of a second inverter 3, an output D of the second inverter is connected to a source of a second EPROM 4, and a drain A of the second EPROM 4 is connected to an input of the first inverter 1. The node A serves as an output of the semiconductor memory circuit.

Figure 2:
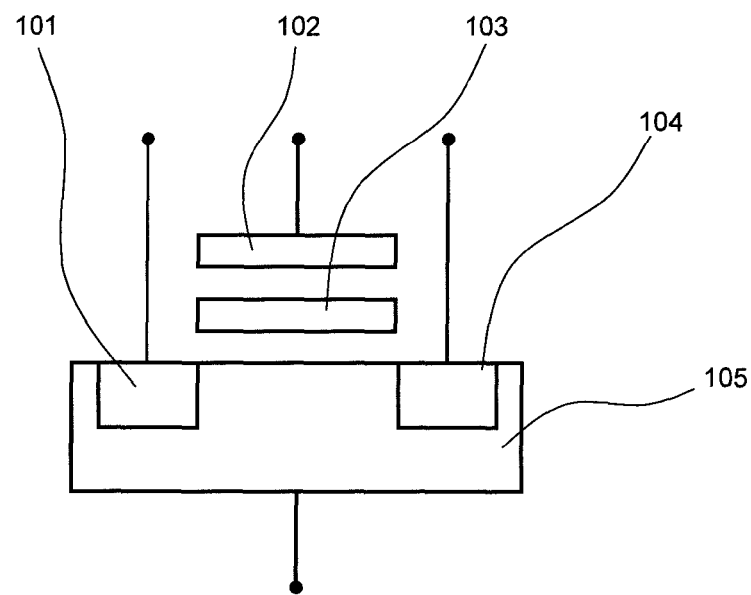
FIG. 2 is a structural cross-sectional view of an EPROM.

The EPROM is one type of non-volatile memories. FIG. 2 is a structural cross-sectional view of the EPROM. The EPROM includes an N-type source 101, a control gate 102, a floating gate 103, an N-type drain 104, and a P-well 105.

In general, an N-channel transistor has a source on the VSS side and a drain on the VDD side. In the first EPROM of FIG. 1, the source and the drain may switch places because the potential of B may take VDD or VSS. In this case, each time the "source" is referred to, the potential needs to be taken into consideration for determining which terminal the source is, which makes the description very hard to understand. Accordingly, in this specification, regardless of the voltage, the left side of the EPROM of FIG. 1 is referred to as "source" and the right side thereof is referred to as "drain" for convenience. In other words, the source of the first EPROM 2 is represented by "B" while the drain thereof is represented by "C", and the source of the second EPROM 4 is represented by "D" while the drain thereof is represented by "A".

Figure 3:
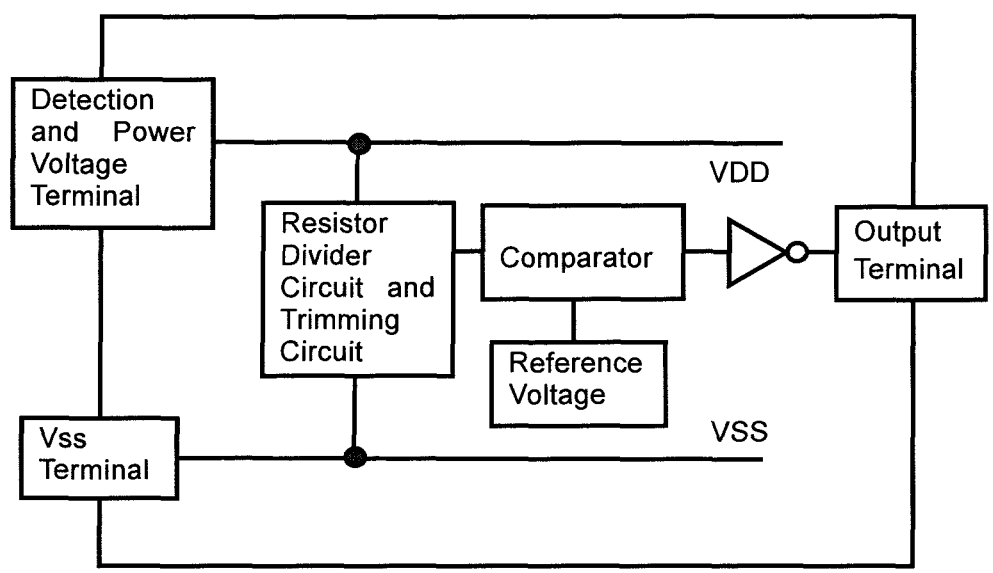
FIG. 3 is a schematic diagram illustrating a configuration of a voltage detector.

In the voltage detector described in the "Description of the Related Art" section, it is often the case that a terminal for the power supply voltage VDD and a terminal for detecting a voltage are shared to prepare three terminals in total, namely a detection/power supply voltage terminal, a VSS terminal, and an output terminal. FIG. 3 illustrates an exemplary configuration of the voltage detector. A resistor voltage divider circuit is arranged between the detection/power supply voltage terminal and the VSS terminal. The potential obtained by voltage division of the resistor voltage divider circuit is compared with a reference potential by a comparator circuit. The comparison result is shaped by an inverter, and High or Low is output from the output terminal.

Figure 4:
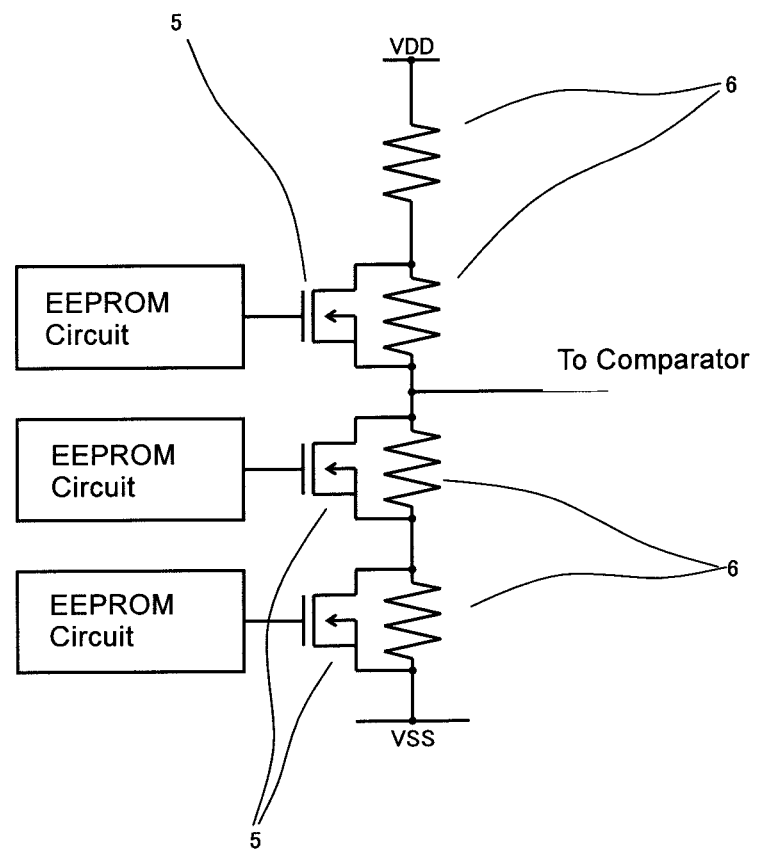
FIG. 4 is a configuration diagram of a trimming circuit using a resistor voltage divider circuit and the EPROMs.

The "RESISTOR VOLTAGE DIVIDER CIRCUIT+ TRIMMING CIRCUIT" illustrated in FIG. 3 has a configuration illustrated in FIG. 4. An EPROM circuit illustrated in FIG. 4 corresponds to the semiconductor memory circuit of the present invention of FIG. 1. Parallel transistors 5 are arranged in parallel to resistors 6 constituting the resistor voltage divider circuit, and an input of the parallel transistor 5 is connected to the output A of the circuit of FIG. 1.

The ON/OFF of the parallel transistor 5 is determined based on the potential of A. In this case, the transistor 5 is an N-channel transistor for convenience. When the potential of A is VDD, the resistor 6 is short-circuited and does not function as a resistor because the transistor 5 is turned ON. When the potential of A is VSS, the resistor 6 functions as a resistor because the transistor 5 is turned OFF. In this manner, the voltage dividing ratio of the resistor voltage divider circuit can be changed depending on the output A from each EPROM circuit. The above-mentioned embodiment is directed to the use of the semiconductor memory circuit of the present invention for trimming of the resistor voltage divider circuit in the voltage detector.

Now, a description is given of the operation of the semiconductor memory circuit illustrated in FIG. 1. The inverter is a general one made up of a P-channel transistor on the VDD side and an N-channel transistor on the VSS side. The EPROM is a general N-channel one, which has a depletion threshold VT before writing and an enhancement threshold VT after writing because electrons are accumulated into the floating gate at the time of writing to make a channel less likely to be inverted. The threshold VT is a gate voltage at which the channel between the source and the drain is switched from OFF to ON when the gate voltage increases. In the EPROM, the threshold VT corresponds to a voltage of the control gate.

In the present invention, writing is performed so that one of the two EPROMs becomes the depletion mode while the other becomes the enhancement mode. In the following, for convenience, the transistor has a threshold VT of 1 V, the depletion EPROM has a threshold VT of −2 V, and the enhancement EPROM has a threshold VT of 2 V. The transistor as used herein refers to all the transistors constituting the first and second inverters and the parallel transistors 5.

First, a description is given of the operation when the first EPROM is in the depletion mode while the second EPROM is in the enhancement mode.

When VDD is 0 V to 1 V, the elements other than the first EPROM are in the OFF state because VDD is smaller than VT. Because the second EPROM is turned OFF, the potential of A is determined by the drain/P-well junction of the second EPROM, the gate parasitic capacitance of the first inverter, and the parasitic capacitance of wiring from the drain of the second EPROM to the input of the first inverter. The potential of A becomes stable at VSS in the long term because junction leakage occurs at the drain/P-well junction of the second EPROM. Accordingly, the potential of A becomes VSS as long as care is taken to prevent the parasitic capacitance from being on the VDD side.

When VDD is 1 V to 2 V, the elements other than the second EPROM can be turned ON. Because the second EPROM is in the OFF state, the potential of A is VSS regardless of the potential of D. Because the input of the first inverter is VSS, the output B of the first inverter is VDD. Because the first EPROM has the threshold VT of −2 V, the potential of C is equal to the potential of B. Because the potential of C is VDD similarly to the potential of B, the output D of the second inverter is VSS. In this manner, the potentials of D and A are equal to each other at VSS.

When VDD becomes 2 V or higher, the second EPROM can be turned ON as well. However, because the potentials of the source and the drain of the second EPROM are equal to each other at VSS as described above, the operation is not different at all from that when VDD is 1 V to 2 V even after the second EPROM is turned ON.

As described above, the output A of this circuit becomes VSS regardless of the voltage VDD.

Next, a description is given of the operation when the first EPROM is in the enhancement mode and the second EPROM is in the depletion mode.

When VDD is 0 V to 1 V, only the second EPROM is in the ON state and the other elements are in the OFF state because VDD is smaller than VT. Because the second EPROM is turned ON but both the N-channel and P-channel transistors of the upstream second inverter are turned OFF, the potential of A depends on various elements. Consideration is now given to the transistor 5 whose input is A. It is assumed that this transistor also has the threshold VT of 1 V. When VDD is 0 V to 1 V, the transistor 5 is in the OFF state regardless of the potential of A. Accordingly, not so much consideration needs to be given to the range of VDD from 0 V to 1 V.

When VDD is 1 V to 2 V, only the first EPROM is turned OFF and the other elements are turned ON. The potential of C is determined by the drain/P-well junction of the first EPROM, the gate parasitic capacitance of the second inverter, and the parasitic capacitance of wiring from the drain of the first EPROM to the input of the second inverter. The potential of C becomes stable at VSS in the long term because junction leakage occurs at the drain/P-well junction of the first EPROM. Accordingly, the potential of C becomes VSS as long as care is taken to prevent the parasitic capacitance from being on the VDD side.

Because the potential of C is VSS, the output D of the second inverter is VDD. Because the second EPROM has the threshold VT of −2 V, the potential of A is equal to the potential of D. Accordingly, the output A of this circuit is VDD. Because the potential of A is VDD, the output B of the first inverter is VSS.

When VDD is 2 V or higher, the first EPROM can be turned ON as well. However, because the potentials of the source and the drain of the first EPROM are equal to each other at VSS as described above, the operation is not different at all from that when VDD is 1 V to 2 V even after the first EPROM is turned ON.

In conclusion, the transistor 5 is turned OFF all the time when the first EPROM is in the depletion mode and the second EPROM is in the enhancement mode.

When the first EPROM is in the enhancement mode and the second EPROM is in the depletion mode, if the voltage VDD becomes lower than the threshold VT of the transistor, the transistor 5 is turned OFF, and if the voltage VDD becomes equal to or higher than the threshold VT of the transistor, the transistor 5 is turned ON.

As described above, it is possible to obtain the circuit in which the transistor 5 is turned ON and OFF in a manner that, depending on which of the first EPROM and the second EPROM is to be written with data, the data is automatically read when the voltage VDD becomes equal to or higher than the threshold VT.

The circuit of the present invention corresponds to a type of latch circuit, but is free from the problem of Japanese Patent Application Laid-open No. Hei 07-122090 because the employed method is completely different from the method of Japanese Patent Application Laid-open No. Hei 07-122090 involving reading data stored in the EPROM at a certain moment and storing the read data in the latch.

Further, in either case where written information is 0 or 1, hot carriers are not generated because a large potential difference is not generated between the source and the drain of every EPROM. In other words, writing does not occur. Further, no steady current flows because a current flowing through the two EPROMs is caused only by electric charges to be charged into the gate capacitance of the inverter connected to the drain and other parasitic capacitances. Also in a transient state, only the current necessary for charging the capacitances with the electric charges flows, and hence the current value is very small. In this manner, because no potential difference occurs between the source and the drain of the EPROM and only a very small current flows therethrough, the corruption of data of the EPROM does not occur.

In FIG. 1, the P-well potential of the EPROM is obtained from VSS, but the back gate is applied in this configuration. To deal with this problem, there may be a case where the P-well potential of the EPROM is set to be equal to the potential of the source of the individual EPROM. Also in this case, similar effects as those described in this embodiment can be obtained.

In this embodiment, the threshold VT of the transistor is 1 V, the threshold VT of the depletion EPROM is −2 V, and the threshold VT of the enhancement EPROM is 2 V, but the values have no significance but are set for convenience.

In this embodiment, the description has been given of the case where the EPROM is an N-channel EPROM. However, the EPROM may be a P-channel EPROM. A detailed description thereof is omitted because this modification can readily be imagined from the details described in this embodiment.

The node A is directly connected to the input of the parallel transistor 5 for short-circuiting the resistor 6 in FIG. 4, but the nature of this patent application is not changed even when a circuit such as an inverter is interposed therebetween to convert a signal or when the parallel transistor 5 is changed to a P-channel transistor.

In this embodiment, the case where the semiconductor memory circuit is used for trimming of the resistor voltage divider circuit has been described for convenience, but the present invention is not limited to this application. Although the EPROM is used as a memory element in this embodiment, the present invention is a circuit effective to the whole field of electrically writable memory elements.

Second Embodiment

Figure 5:
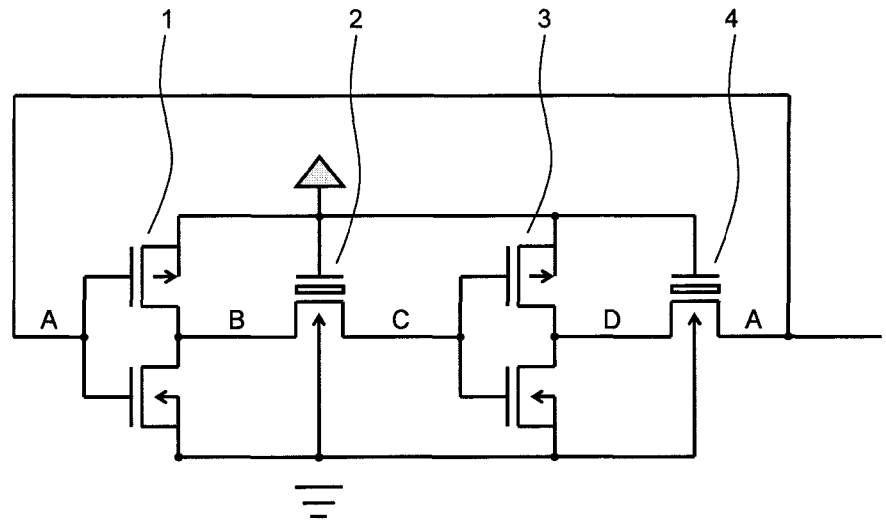
FIG. 5 is a semiconductor memory circuit of the present invention, in which a control gate of the EPROM is fixed to VDD.

A description is given with reference to FIG. 5. FIG. 5 is modified from FIG. 1 by fixing the potentials of the control gates of the EPROMs to the VDD level. In the following description, digital signals of 0 and 1 are used.

The role of the N-channel EPROM having the depletion threshold VT is to output 1 when the upstream output is 1 and output 0 when the upstream output is 0. In the role, the N-channel EPROM does not need to be turned OFF. By fixing the control gate of the N-channel EPROM having the depletion threshold VT to VDD, the N-channel EPROM becomes more likely to be turned ON, which satisfies the role.

The role of the N-channel EPROM having the enhancement threshold VT described in the first embodiment is to be turned OFF all the time or to be turned OFF when the VDD level is lower than the threshold VT of the transistor and be turned ON when the VDD level is higher than the threshold VT of the transistor. By setting the threshold VT of the enhancement N-channel EPROM to be higher than the threshold VT of the transistor, the role can be satisfied even when the potential of the control gate is fixed to VDD.

In the above, the description has been given that, even when the control gate of the N-channel EPROM is fixed to the VDD level, the circuit operation is the same as that described in the first embodiment.

When the upstream inverter outputs 1, the back gate is applied to the N-channel EPROM. Accordingly, the N-channel EPROM having the depletion threshold VT outputs a value falling a little short of 1, specifically, a voltage slightly lower than VDD. As the voltage of the control gate of the N-channel EPROM becomes higher, a value closer to 1, specifically, a potential closer to the VDD potential can be output.

When the VDD level becomes higher than the threshold VT of the transistor and the potential of each wiring of the circuit of FIG. 1 becomes stable, and thereafter the N-channel EPROM having the enhancement threshold VT is turned ON, the circuit of FIG. 1 is further stabilized in circuit operation because the inputs and the outputs form a single circle.

In this embodiment, the description has been given of the case where the EPROM is an N-channel EPROM, but in the case where two EPROMs are formed of P-channel EPROMs, the operation is reversed between the N-channel and the P-channel, and hence by fixing the potential of the control gate to VSS, a circuit that operates similarly can be obtained. A detailed description thereof is omitted because this modification can readily be imagined from the description of the N-channel EPROMs.

Third Embodiment

Figure 6:
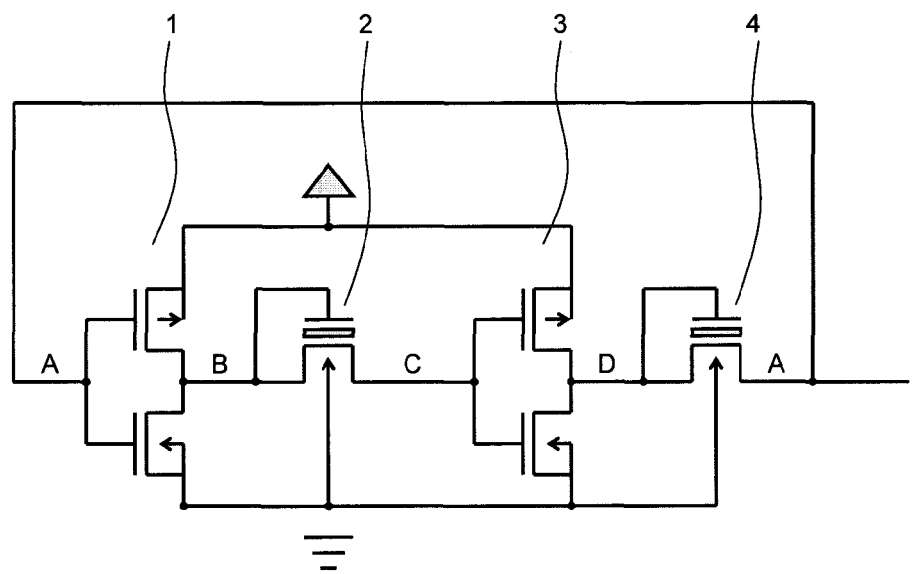
FIG. 6 is a semiconductor memory circuit of the present invention, in which a control gate of the EPROM is connected to a source thereof.

A description is given with reference to FIG. 6. FIG. 6 is modified from FIG. 1 by connecting the control gates of the EPROMs to the respective sources of the EPROMs.

The role of the N-channel EPROM having the depletion threshold VT is to output 1 when the upstream output is 1 and output 0 when the upstream output is 0.

When the upstream inverter outputs 1, the back gate is applied to the N-channel EPROM. Accordingly, the N-channel EPROM having the depletion threshold VT outputs a value falling a little short of 1, specifically, a voltage slightly lower than VDD. As the voltage of the control gate of the N-channel EPROM becomes higher, a value closer to 1, specifically, a potential closer to the VDD potential can be output.

When the upstream inverter outputs 0, because the back gate is not applied to the N-channel EPROM, the N-channel EPROM having the depletion threshold VT can directly output 0 even if the potential of the control gate is VSS.

As described above, it is understood that the control gate of the N-channel EPROM having the depletion threshold VT only needs to have the same level as the output of the upstream inverter. The output of the upstream inverter is connected to the source of the N-channel EPROM.

The role of the N-channel EPROM having the enhancement threshold VT described in the first embodiment is to be turned OFF all the time, or to be turned OFF when the VDD level is lower than the threshold VT of the transistor and be turned ON when the VDD level is higher than the threshold VT of the transistor. It can be rephrased that the role of the enhancement N-channel EPROM is to be turned OFF at least when the VDD level is lower than the threshold VT of the transistor.

As long as the threshold VT of the enhancement N-channel EPROM is set to be higher than the threshold VT of the transistor, when the upstream inverter outputs 1 and when the control gate of the EPROM is connected to the source, the potential of the control gate is VDD. Because the threshold VT of the EPROM is larger than the threshold VT of the transistor, the EPROM is turned OFF when the VDD level is lower than the threshold VT of the transistor.

When the upstream inverter outputs 0 and when the control gate of the enhancement N-channel EPROM is connected to the source, the potential of the control gate is at the VSS level. At this time, the EPROM is turned OFF.

As described above, it is understood that the same operation as described in the first embodiment is performed even when the control gate of the EPROM is connected to the source of the individual EPROM.

In this embodiment, the description has been given of the case where the EPROM is an N-channel EPROM, but a detailed description of the case where two EPROMs are formed of P-channel EPROMs is omitted because this modification can readily be imagined from the above description of the N-channel EPROM.

The optimum control of the control gate of the EPROM may vary depending on the applied process or the characteristics of the EPROM. Specific examples of the control of the control gate have been described with reference to FIG. 5 in the second embodiment and FIG. 6 in the third embodiment, but other cases, such as the case where no control gate is arranged, the case where the control gate is controlled only by the parasitic capacitance, the case where the control gate is connected to the drain, the case where the control gate is connected to VSS, the case where the potential of the control gate is varied between data reading and data writing, and a combination of the cases, belong to the optimization, and the novelty of the present invention is not lost.

Fourth Embodiment

Figure 7:
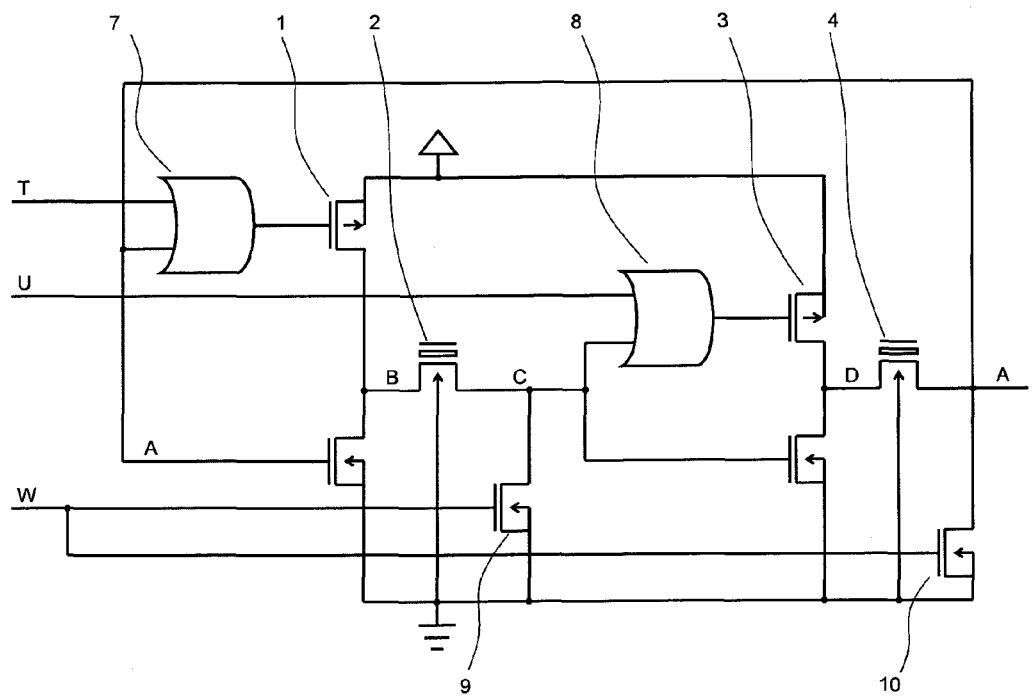
FIG. 7 is a semiconductor memory circuit of the present invention, in which a write circuit is incorporated.

A description is given with reference to FIG. 7. FIG. 7 is obtained by incorporating a write circuit in the EPROM circuit of FIG. 1. How the data is selectively written by signals T, U, and W is described. In the following description, digital signals of 0 and 1 are used.

Case of T=0, U=1, and W=1

A first N-channel transistor 9 and a second N-channel transistor 10 are turned ON. Accordingly, the potentials of A and C become VSS, namely 0. OR circuits are designed to output 0 when two inputs are both 0, and output 1 in other combinations of the inputs. Because A=0 and T=0 are established in this case, the output of a first OR circuit 7 is 0. The P-channel transistor constituting the first inverter is turned ON, and the N-channel transistor constituting the first inverter is turned OFF. Accordingly, the potential of B becomes VDD. Because the potential of C is VSS, a large voltage is applied between the source and the drain of the first EPROM 2 to perform writing. Because the input of a second OR circuit 8 is U=1, the output of the second OR circuit is 1, and the P-channel transistor constituting the second inverter is turned OFF. Because the potential of C is 0, the N-channel transistor constituting the second inverter is turned OFF. In this manner, both the P-channel transistor and the N-channel transistor constituting the second inverter are turned OFF. Accordingly, a high voltage is not applied between the source and the drain of the second EPROM 4, and writing to the second EPROM is not performed.

Case of T=1, U=0, and W=1

The first N-channel transistor 9 and the second N-channel transistor 10 are turned ON. Accordingly, the potentials of A and C become VSS, namely 0. Because the inputs of the first OR circuit are 1 and 0, the output of the first OR circuit is 1. Because the potential of A is 0, both the P-channel transistor and the N-channel transistor constituting the first inverter are turned OFF. Accordingly, a high voltage is not applied between the source and the drain of the first EPROM, and writing is not performed. Because the inputs of the second OR circuit are 0 and 0, the output of the second OR circuit is 0. Because the P-channel transistor and the N-channel transistor constituting the second inverter are turned ON and OFF, respectively, the potential of D is VDD. Because the potential of A is VSS, a large voltage is applied between the source and the drain of the second EPROM to perform writing.

Case of T=0, U=0, and W=0

The first N-channel transistor and the second N-channel transistor are turned OFF. Because the signal T as one input of the first OR circuit is 0, the first OR circuit outputs the same level as the other input A. Because the signal U as one input of the second OR circuit is 0, the second OR circuit outputs the same level as the other input C. Accordingly, in this case, the circuit of FIG. 5 is equivalent to the circuit of FIG. 1 described in the first embodiment. Because this state is the reading or holding state, when the three wirings T, U, and W are connected on the VSS side via resistors, the writing does not occur unless a special signal is provided to the wirings T, U, and W, which further enhances the reliability.

Case of T=0, U=0, and W=0

The operation mechanism is the same as in the first embodiment described with reference to FIG. 1, but an element not provided in FIG. 1 is added. The operation is examined below.

Figure 8:
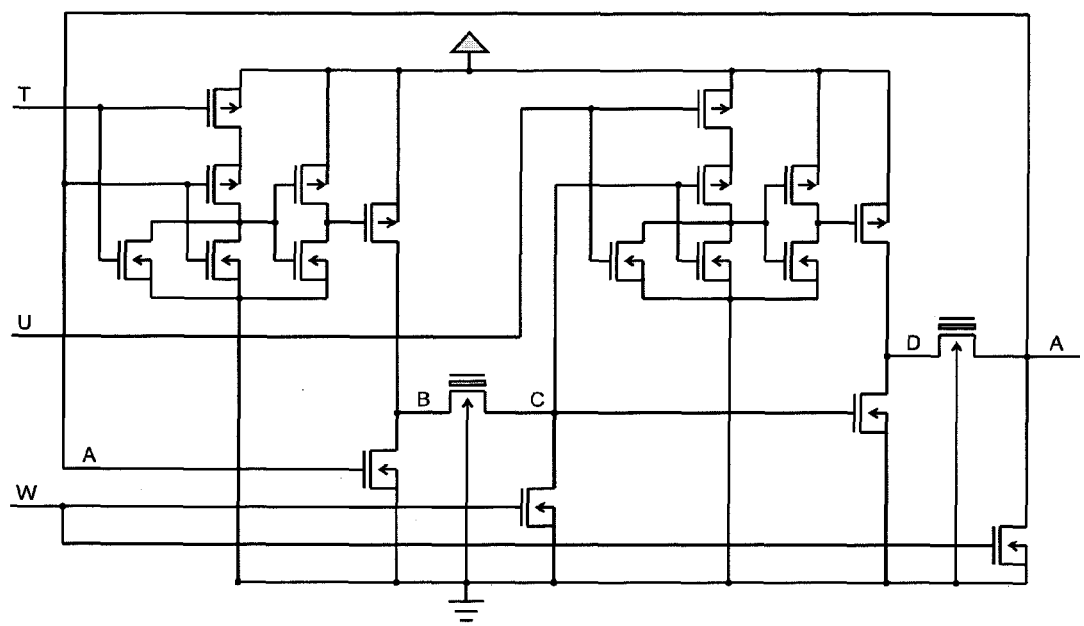
FIG. 8 is a detailed diagram of FIG. 7.

FIG. 8 is a detailed diagram in which the OR circuits of FIG. 7 are exploded into transistors for easy understanding. The function of the circuits is exactly identical to that of FIG. 7. The OR circuit is formed by arranging two N-channel transistors in parallel on the VSS side and two P-channel transistors in series on the VDD side and by inverting an output by an inverter. One input of the OR circuit is connected to a gate of one N-channel transistor and a gate of one P-channel transistor, and the other input of the OR circuit is connected to a gate of the remaining one N-channel transistor and a gate of the remaining one P-channel transistor. This structure is very typical for a CMOS OR circuit.

First, a description is given of the operation when the first EPROM is in the depletion mode and the second EPROM is in the enhancement mode.

The condition is T=U=W=0. The node A is not directly electrically connected anywhere because the second EPROM is turned OFF and the second N-channel transistor is also turned OFF. In this case, the potential of A is determined by N-type drain/P-well junction leakage of the second EPROM, N-type drain/P-well junction leakage of the second N-channel transistor, and the parasitic capacitance. Because the junction leakage occurs at the drain/P-well junction, the potential of A becomes stable at VSS in the long term. Accordingly, the potential of A becomes VSS even at a moment as long as care is taken to prevent the parasitic capacitance from being on the VDD side. In other words, A=0 is established. Because A=0 is established, both the two inputs of the first OR circuit are 0. Accordingly, the output of the first OR circuit is 0. B=1 is established because the N-channel transistor constituting the first inverter is turned OFF and the P-channel transistor constituting the first inverter is turned ON. C=1 is established because the first EPROM is turned ON. Because the two inputs of the second EPROM are 0 and 1, the output is 1. D=0 is established because the N-channel transistor constituting the second inverter is turned ON and the P-channel transistor constituting the second inverter is turned OFF. Because D=0 and A=0 are established, no voltage is applied between the source and the drain of the turned-OFF second EPROM. Accordingly, even when VDD further increases to turn ON the second EPROM, this state remains unchanged. The same holds true even when the first EPROM is in the enhancement mode and the second EPROM is in the depletion mode, and hence a description thereof is omitted.

For easy understanding, a description is given of the first EPROM in this embodiment. An N-channel transistor is arranged between C and VSS, and the P-channel transistor constituting the first inverter is controlled to be turned ON/OFF by another input T. In this manner, the P-channel transistor connected to the VDD side of the EPROM and the N-channel transistor connected to the VSS side of the EPROM can both be turned ON, and writing is realized by applying a large voltage between the source and the drain of the EPROM.

By arranging a transistor between C and VDD so as to control the N-channel transistor constituting the first inverter by another input, writing can be realized by applying a large voltage between the source and the drain of the EPROM similarly to the above. This can readily be imagined from the details described in this embodiment, and hence a detailed description thereof is omitted.

While the EPROM is an N-channel EPROM in this embodiment, the same holds true for a P-channel EPROM.

Fifth Embodiment

Figure 9:
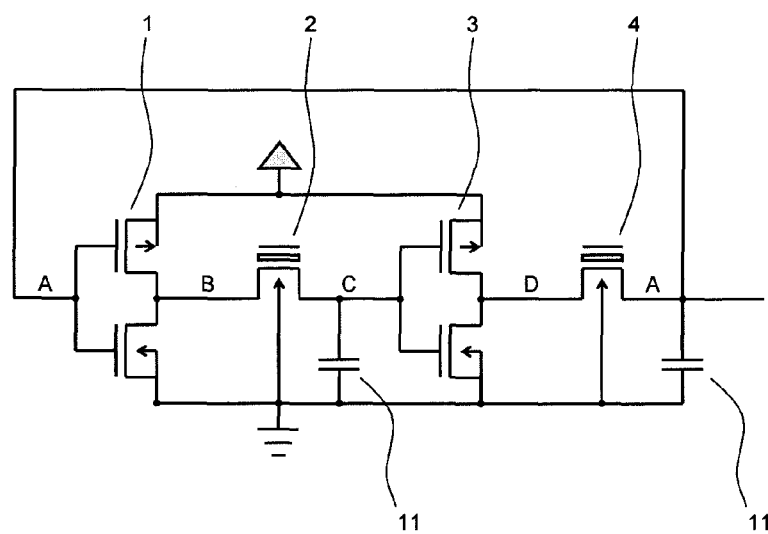
FIG. 9 is a semiconductor memory circuit of the present invention, in which capacitors are incorporated.

A description is given with reference to FIG. 9. A circuit of FIG. 9 is formed by adding to the circuit of FIG. 1 capacitors 11 between C and VSS and between A and VSS.

As described in the first embodiment, for example, when the first EPROM is turned OFF with the enhancement threshold VT, the input of the second inverter is determined by diode leakage or parasitic capacitance. By providing the capacitor between C and VSS, when the first EPROM is turned OFF, the level of C becomes VSS or becomes closer to VSS more reliably. In this way, the input of the second inverter is regarded as 0 more reliably.

In the case where the first EPROM is turned ON with the depletion threshold VT, when the output of the first inverter is 1, the level of C is 1. This state remains unchanged even when the capacitor is added between C and VSS. The same holds true for the capacitor between A and VSS.

The above description is for the case where the circuit is designed so that the drain of the EPROM may be 0 when the EPROM is turned OFF. In the case where the circuit is designed so that the drain of the EPROM may be 1 when the EPROM is turned OFF, the capacitors are added between C and VDD and between A and VDD. A detailed description is omitted because the details are the same as above.

Figure 10:
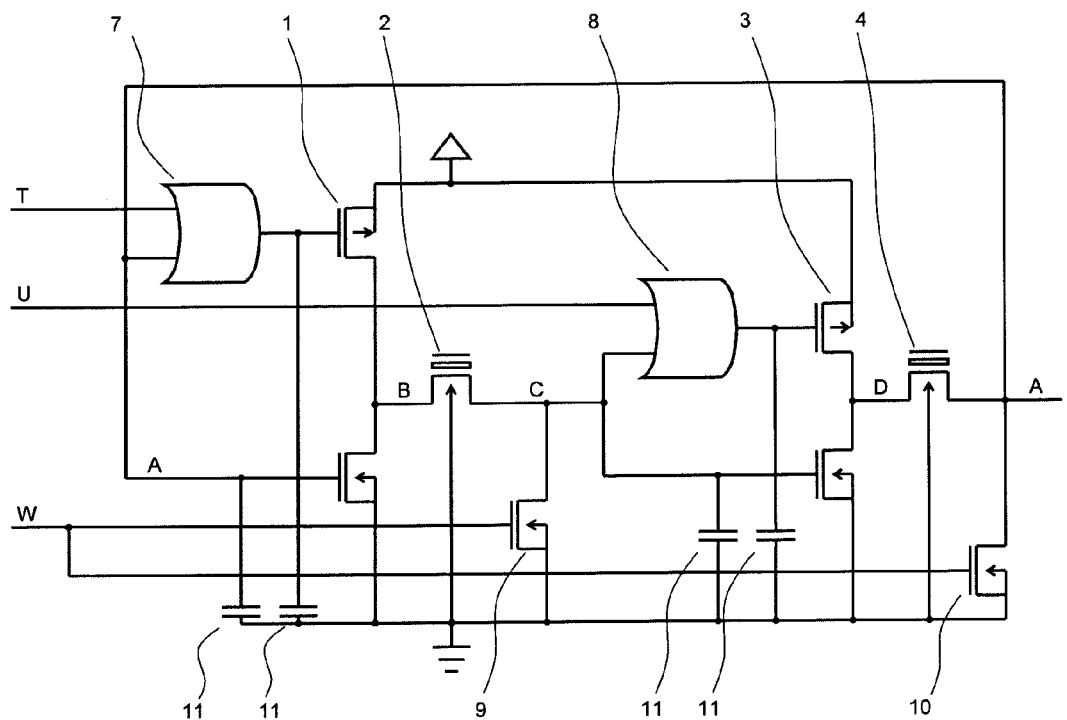
FIG. 10 is a semiconductor memory circuit of the present invention, which is modified by incorporating capacitors in FIG. 7.

FIG. 10 is a diagram obtained by adding capacitors 11 to the write circuit of FIG. 7 for the same purpose as described above. Because the inputs of the N-channel and P-channel transistors constituting the inverter are controlled independently, the capacitors are added between the respective transistors and VSS. This configuration serves the same role as described above.

Sixth Embodiment

Figure 11:
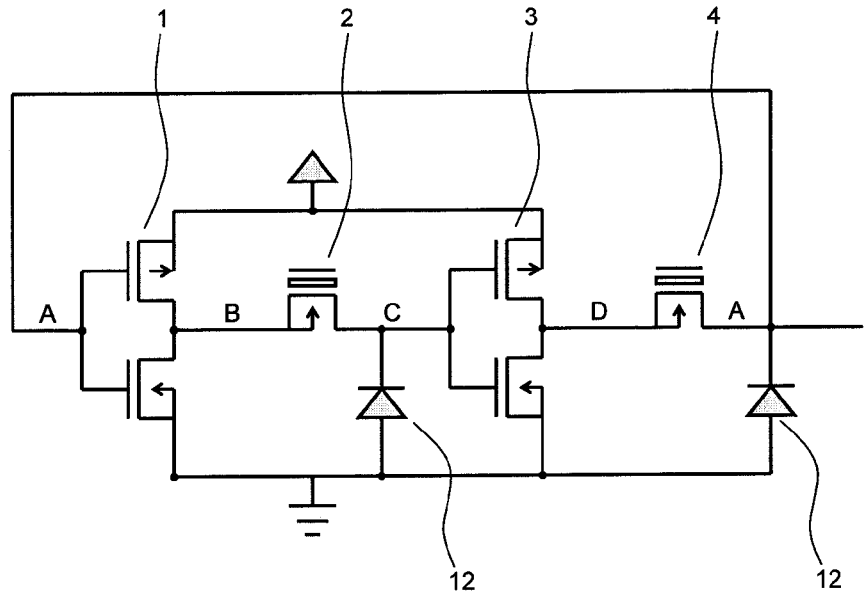
FIG. 11 is a memory circuit of the present invention, in which diodes are incorporated.

A description is given with reference to FIG. 11. As illustrated in FIG. 11, diodes are inserted in the reverse direction between C and VSS and between A and VSS. For example, when the EPROM is turned OFF, the input of the inverter corresponding to the drain of the EPROM is not directly connected to VSS or VDD. Accordingly, the electric charges stored in the input wiring capacitance or in the gate capacitance are hardly discharged. The electric charges are discharged to P-well mainly via the N-type drain/P-well junction of the EPROM and to VSS.

When actually used in a product, there may be a case where VDD abruptly drops and thereafter abruptly rises. Also in such a case, in order to perform a proper operation, the stored electric charges need to be discharged following the operation. By providing the diodes between C and VSS and between A and VSS, the effect of increasing the rate of discharging the electric charges can be obtained.

The diodes have no relationship to the operation when the EPROM is turned ON because the diodes are connected in the reverse direction.

The above description is for the case where the circuit is designed so that the drain of the EPROM may be 0 when the EPROM is turned OFF. In the case where the circuit is designed so that the drain of the EPROM may be 1 when the EPROM is turned OFF, the diodes are added in the reverse direction between C and VDD and between A and VDD. A detailed description is omitted because the details are the same as above.

Seventh Embodiment

Figure 12:
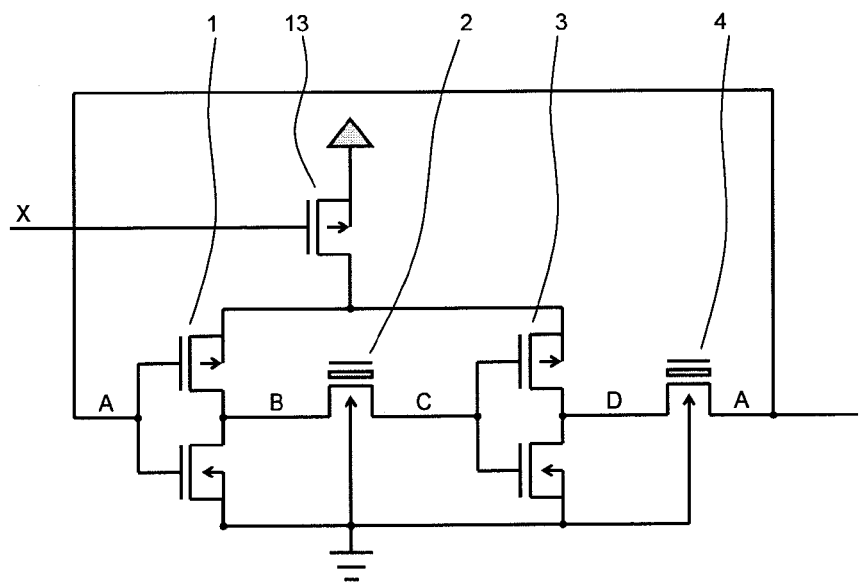
FIG. 12 is a memory circuit of the present invention, in which a P-channel transistor is incorporated between VDD and the memory circuit.

A description is given with reference to FIG. 12. FIG. 12 is modified from the circuit of FIG. 1 by adding a P-channel transistor 13 between VDD and the semiconductor memory circuit. The P-channel transistor is controlled by X. In writing and reading, X is set to 0 so as to turn ON the P-channel transistor. In an actual product, noise often enters the power supply. By providing the P-channel transistor between VDD and the semiconductor memory circuit, the resistance to noise can be enhanced.

The operation when writing is performed in a manner that one of the two EPROMs constituting the semiconductor memory circuit of the present invention is in the depletion mode while the other is in the enhancement mode is as described in the first embodiment. It is, however, often intended to measure the product before writing. In such a case, if the EPROM is an N-channel EPROM, the output A of the semiconductor memory circuit of the present invention is unstable because the N-channel EPROM is generally in the depletion mode before the writing.

To deal with this, the P-channel transistor 13 is turned OFF when the measurement is performed before writing. The measurement is possible because A is always 0.

Eighth Embodiment

In general, it is often the case that the EPROM is written on the manufacturer side and is not written after distributed to a consumer. Accordingly, by providing a write protection circuit and controlling the EPROM based on an output from the write protection circuit, the reliability is further enhanced.

Figure 13:
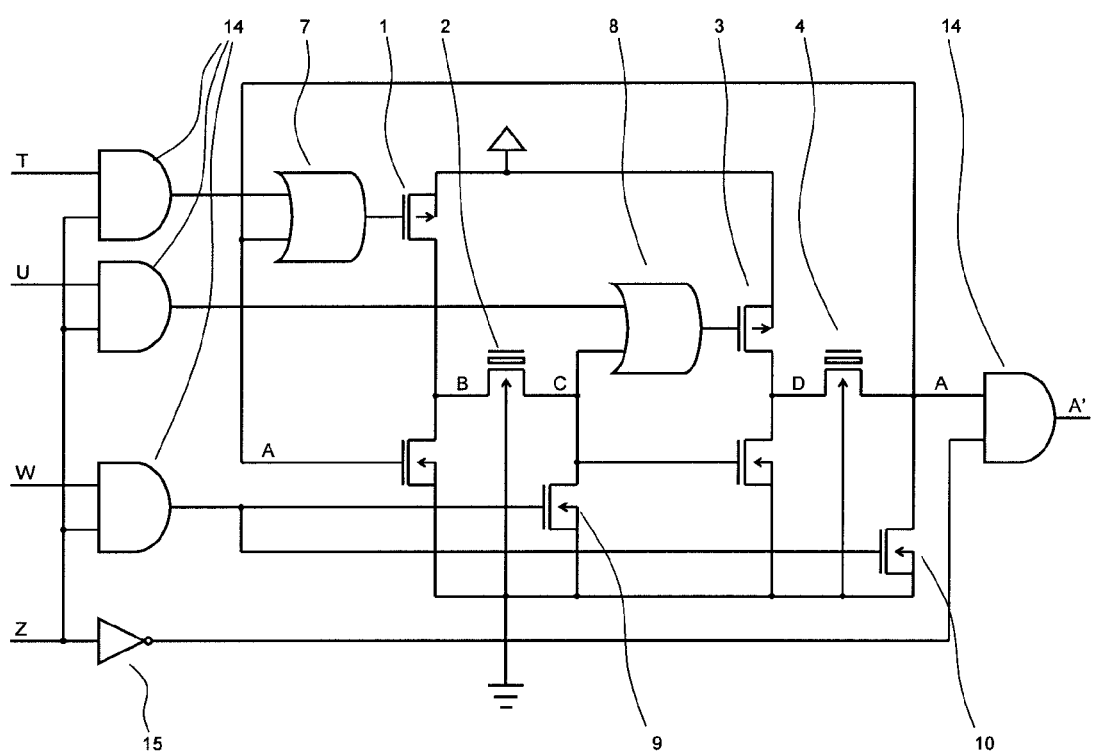
FIG. 13 is a memory circuit of the present invention, which is modified by adding a write protection signal to FIG. 7.

A description is given with reference to FIG. 13. FIG. 13 is obtained by adding an output Z from the write protection circuit to FIG. 7. Before entering a write-protected mode, Z=1 is established. When entering the write-protected mode, Z=0 is established.

The signals T, U, and W of FIG. 7 and the signal Z are input to AND circuits 14, and the outputs from the AND circuits 14 are connected to the nodes at which the signals T, U, and W are connected in FIG. 7. The signal Z is inverted via an inverter 15. The inverted signal and the output A are input to an AND circuit, and an output from the AND circuit is used as an output A' from the semiconductor memory circuit. The AND circuit is a commonly-used circuit designed to output 1 when the two inputs are 1 and output 0 in other cases.

When Z=1 is established, the outputs from the AND circuits having the inputs T, U, and W are the same as T, U, and W. Accordingly, the operation is the same as the writing described in the above-mentioned fourth embodiment. In other words, the writing is possible before entering the write-protected mode.

When Z=0 is established, the outputs from the AND circuits having the inputs T, U, and W are 0 regardless of the values of T, U, and W. Because this state is the reading state as described above in the fourth embodiment, writing is inhibited.

When Z=1 is established, because the value obtained by inverting the signal Z is input to the AND circuit, the output A' becomes 0 regardless of the output A. This means that the output from the semiconductor memory circuit is determined even before writing, which is advantageous in that the product can be measured before writing When Z=0 is established, the output A' becomes equal to the output A. Accordingly, when entering the write-protected mode, the output A' becomes 1 or 0 depending on writing into the EPROM.

The description has been given of the utilization with reference to FIG. 13 on the assumption that Z=1 is established before entering the write-protected mode and Z=0 is established after entering the write-protected mode. However, this is just for convenience. In contrast, Z=0 may be established before entering the write-protected mode and Z=1 may be established after entering the write-protected mode. In this case, the circuit configuration is merely changed in that the logics of the AND circuits and the inverter added to FIG. 13 from FIG. 7 are changed to different ones. This change has no novelty, and hence a detailed description thereof is omitted.

Ninth Embodiment

Figure 14:
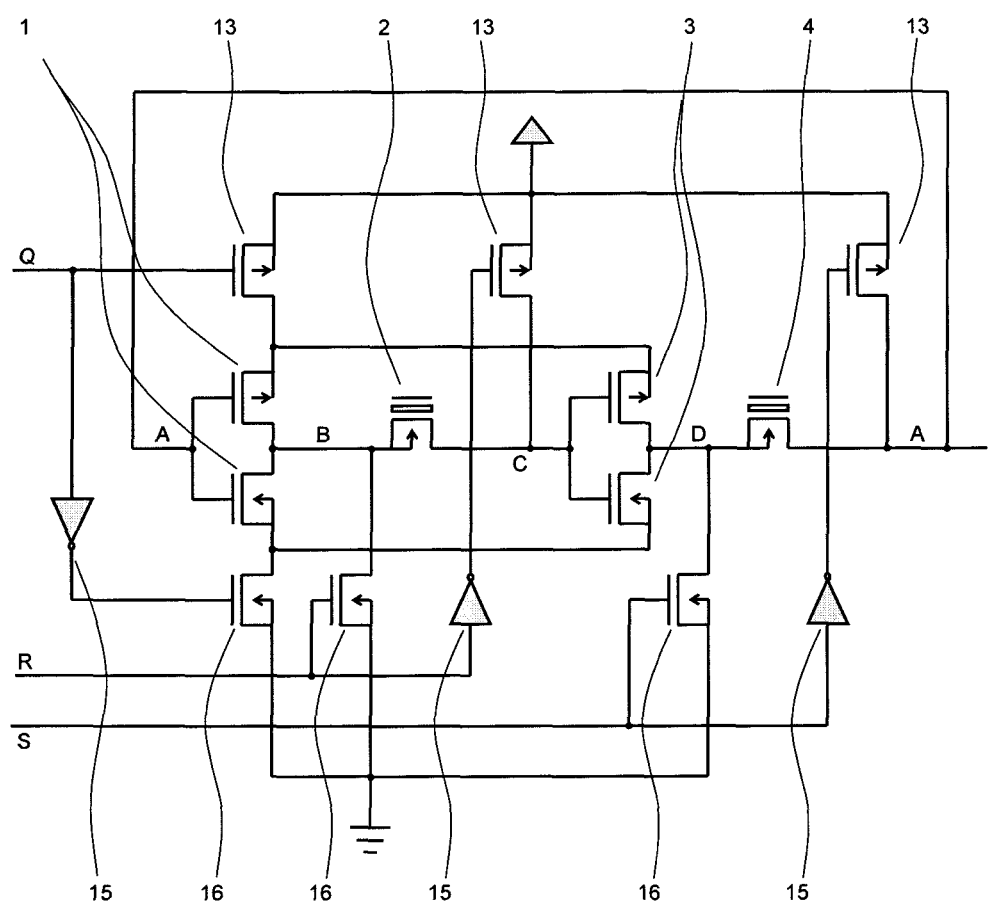
FIG. 14 is a memory circuit of the present invention, in which a write circuit of another type than that of FIG. 7 is incorporated.

A description is given with reference to FIG. 14. FIG. 14 is obtained by adding a P-channel transistor 13 between the inverters 1 and 3 and VDD of FIG. 1, an N-channel transistor 16 between the inverters 1 and 3 and VSS, an N-channel transistor between the source of the EPROM and VSS, and a P-channel transistor between the drain of the EPROM and VDD. The P-channel transistor between the inverters 1 and 3 and VDD inputs a signal Q. The input of the N-channel transistor between the inverters 1 and 3 and VSS is a signal obtained by inverting the signal Q by an inverter 15.

The input of the N-channel transistor between the source of the first EPROM and VSS is a signal R. The input of the P-channel transistor between the drain of the first EPROM and VDD is a signal obtained by inverting the signal R by another inverter 15.

The input of the N-channel transistor between the source of the second EPROM and VSS is a signal S. The input of the P-channel transistor between the drain of the second EPROM and VDD is a signal obtained by inverting the signal S by another inverter 15.

When Q=1, R=0, and S=1 are established, the P-channel transistor between the inverters 1 and 3 and VDD is turned OFF, and the N-channel transistor between the inverters 1 and 3 and VSS is turned OFF. Both the N-channel transistor between the source of the first EPROM and VSS and the P-channel transistor between the drain of the first EPROM and VDD are turned OFF. Both the N-channel transistor between the source of the second EPROM and VSS and the P-channel transistor between the drain of the second EPROM and VDD are turned ON. In this state, when the voltage VDD increases, writing occurs only in the second EPROM.

When Q=1, R=1, and S=0 are established, the P-channel transistor between the inverters 1 and 3 and VDD is turned OFF, and the N-channel transistor between the inverters 1 and 3 and VSS is turned OFF. Both the N-channel transistor between the source of the first EPROM and VSS and the P-channel transistor between the drain of the first EPROM and VDD are turned ON. Both the N-channel transistor between the source of the second EPROM and VSS and the P-channel transistor between the drain of the second EPROM and VDD are turned OFF. In this state, when the voltage VDD increases, writing occurs only in the first EPROM.

When Q=R=S=0 is established, the N-channel transistors that connect the respective sources of the two EPROMs to VSS are turned OFF, and the P-channel transistors that connect the respective drains of the EPROMs and VDD are turned OFF. The N-channel transistor that connects the inverters 1 and 3 and VSS is turned ON, and the P-channel transistor that connects the inverters 1 and 3 and VDD is turned ON. This state is equivalent to the circuit described in the first embodiment. In other words, when Q=R=S=0 is established, the memory circuit becomes the reading state described in the first embodiment.

Similar effects can be obtained even by replacing the above-mentioned transistors arranged between the source of the EPROM and VSS and between the drain thereof and VDD with a P-channel transistor arranged between the source of the EPROM and VDD and an N-channel transistor arranged between the drain thereof and VSS. Detailed descriptions thereof are, however, omitted because those effects can easily be inferred from the foregoing. In general, when the magnitude of the voltage applied to the source and the drain is reversed between writing and reading, the effect that the VT shift becomes larger in writing can be obtained.

Tenth Embodiment

Figure 15:
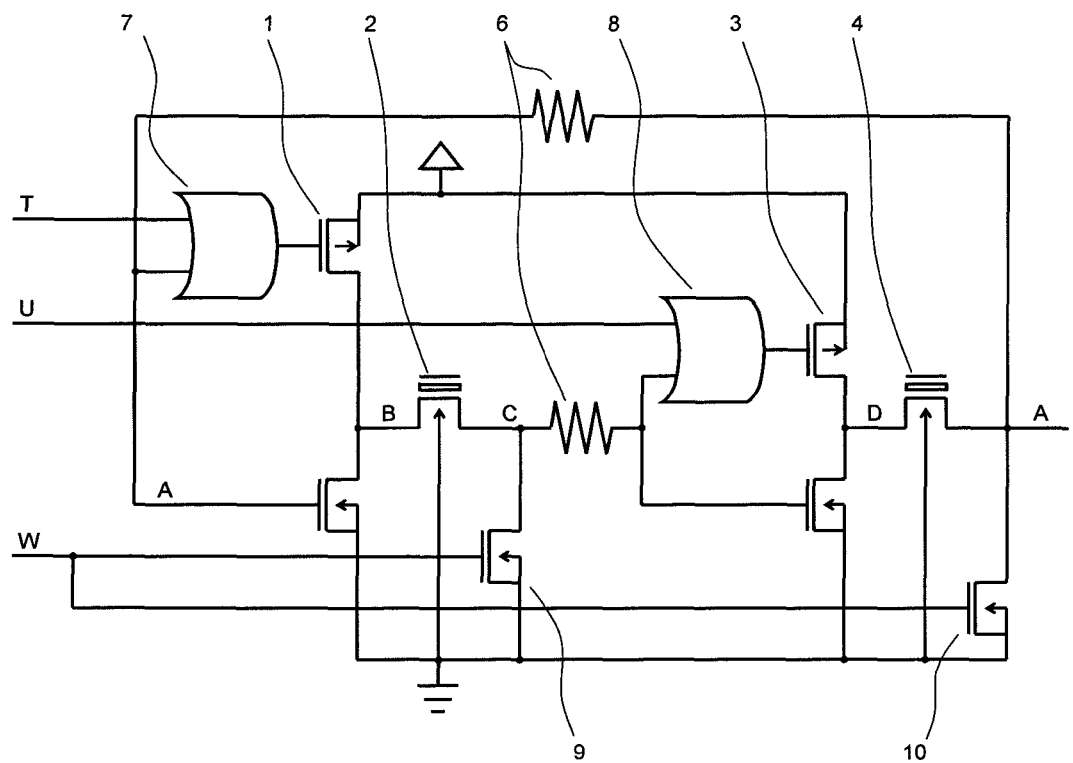
FIG. 15 is a memory circuit of the present invention, which is modified by incorporating resistors in FIG. 7.

A description is given with reference to FIG. 15. FIG. 15 is obtained by adding resistors to FIG. 7. The resistors are arranged at the nodes A and C, that is, between the EPROM and an input of the downstream circuit. A relatively large voltage is applied between the source and the drain of the EPROM only in a so-called transient state, that is, upon the accumulation of electric charges in the downstream gate and in other parasitic capacitances or upon the discharge of the accumulated electric charges. Because the downstream gate capacitance is particularly large, by arranging the resistor at the upstream of the gate, the peak of the voltage in the transient state is suppressed. In other words, an instantaneous voltage is prevented from being applied between the source and the drain of the EPROM, and hence the reliability against erroneous writing is improved.

In the case where the write N-channel transistor as illustrated in FIG. 15 is arranged, when the resistor is arranged at the immediate downstream of the drain of the EPROM, the peak of the voltage in the transient state can be further suppressed. However, if the resistor is arranged at this position, the resistor functions as a parasitic resistor in writing, and a write voltage or a write period increases accordingly. To deal with this problem, in order to decrease the write voltage, it is desired to arrange the resistor not at the immediate downstream of the drain of the EPROM but at the downstream of the write transistor as illustrated in FIG. 15 so that the resistor may be irrelevant to the writing. When more importance is given to the reliability in reading than the write voltage, the resistor is arranged at the immediate downstream of the drain of the EPROM. This selection depends on the application of the memory circuit and process characteristics.

Further, by arranging the resistors also at the nodes B and D, the peak of the voltage in the transient state can be further suppressed. However, when the write voltage is desired to be decreased, it is preferred to arrange the resistors only at the nodes A and C. The reason is the same as described above.

In the case of FIG. 14, because writing can be performed without using the inverters 1 and 3, even when the resistors are arranged at all the nodes A, B, C, and D so as to suppress the peak of the voltage in the transient state, the write voltage can be decreased. Also in this case, by arranging the resistor between the EPROM and the write transistor, the peak of the voltage in the transient state can be further suppressed. When the resistor is arranged between the write transistor and the inverter 1 or 3, writing can be performed with a lower voltage although the peak of the voltage in the transient state is increased a little.

In the case of FIG. 1, by inserting the resistors only at the nodes A and C, the reliability is enhanced. Further, by arranging the resistors at all the nodes A, B, C, and D, the reliability is further enhanced. The details are the same as described above, and hence a detailed description thereof is omitted.

Eleventh Embodiment

Figure 16:
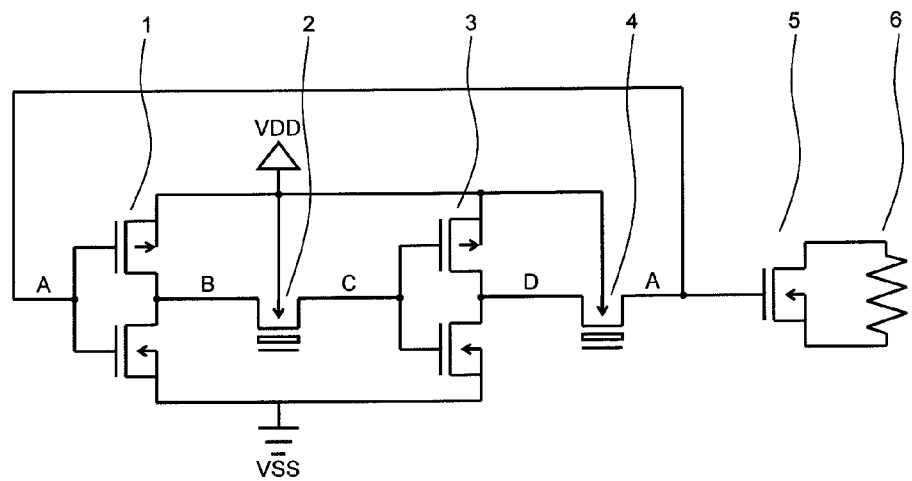
FIG. 16 is a semiconductor memory circuit of the present invention, in which P-channel EPROMs are used.
Figure 17:
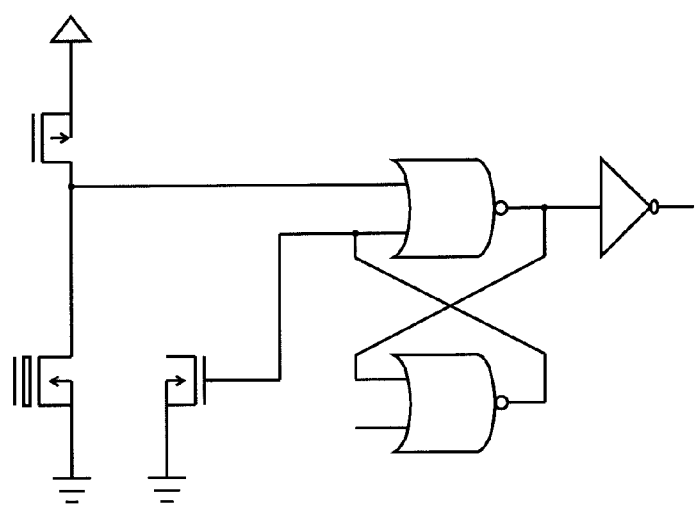
FIG. 17 is a conventional semiconductor memory circuit.

A description is given with reference to FIG. 16. FIG. 16 is a diagram obtained by changing the EPROMs of FIG. 1 to P-channel EPROMs. The operation itself can be easily inferred from the first embodiment, but the P-channel EPROMs can actively utilize a phenomenon that is not described in the first embodiment. The phenomenon is described below.

The input of the inverter 1 or 3 is connected to the drain of the upstream P-channel EPROM, and the drain is formed in an Nwell at the VDD level. Accordingly, when the EPROM is turned OFF, the input potential of the inverter can be set to the VDD level. The output of the inverter whose input is the VDD level is 0.

After data writing, that is, after writing is performed in a manner that one of the two P-channel EPROMs constituting the circuit of FIG. 16 has a depletion threshold VT while the other has an enhancement threshold VT, when the P-channel EPROM whose source is connected to the output 0 of the inverter has the depletion threshold VT, the output 0 is input to the downstream inverter, and the output of this inverter becomes 1. The P-channel EPROM whose source is connected to the output 1 has the enhancement threshold VT.

From the above, the depletion P-channel EPROM is applied with the potential of 0 between the source and the drain and with the potential of the VDD level at the Nwell. In this case, a phenomenon called "band-to-band tunneling" generally occurs in the P-channel EPROM, and electrons are injected into the gate electrode.

In general, the P-channel EPROM operates in the enhancement mode before writing and in the depletion mode after writing. Accordingly, the phenomenon allows the writing to proceed more in the EPROM after writing. This is the phenomenon that can be utilized when the P-channel EPROM is used, which is not described in the first embodiment. Utilizing this phenomenon, a more reliable EPROM circuit can be realized. Also in the N-channel EPROM, the phenomenon called "band-to-band tunneling" occurs, but is significantly smaller than in the P-channel EPROM in general.

FIG. 3
(1) DETECTION/POWER SUPPLY VOLTAGE TERMINAL
(2) RESISTOR VOLTAGE DIVIDER CIRCUIT+TRIMMING CIRCUIT
(3) COMPARATOR CIRCUIT
(4) OUTPUT TERMINAL
(5) VSS TERMINAL
(6) REFERENCE VOLTAGE

FIG. 4
(1) EPROM CIRCUIT
(2) TO COMPARATOR CIRCUIT

What is claimed is:

1. A semiconductor memory circuit, comprising:
a first inverter;
a first non-volatile memory, which is electrically writable;
a second inverter; and
a second non-volatile memory,
the first inverter having an output connected to a source of the first non-volatile memory,
the first non-volatile memory having a drain connected to an input of the second inverter,
the second inverter having an output connected to a source of the second non-volatile memory,
the second non-volatile memory having a drain connected to an input of the first inverter,
the drain of the second non-volatile memory serving as an output of the semiconductor memory circuit.

2. A semiconductor memory circuit according to claim 1, wherein the first non-volatile memory and the second non-volatile memory each include a control gate having a potential fixed to one of a VDD level and a VSS level.

3. A semiconductor memory circuit according to claim 1:
wherein the first non-volatile memory includes a control gate connected to the source of the first non-volatile memory; and
wherein the second non-volatile memory includes a control gate connected to the source of the second non-volatile memory.

4. A semiconductor memory circuit according to claim 1, further comprising:
a circuit for controlling an operation of each transistor included in the first inverter, and a circuit for controlling an operation of each transistor included in the second inverter;
a transistor, which is arranged between wiring for connecting an output of the first non-volatile memory and a downstream one of the first inverter and the second inverter, and one of VSS and VDD, and a transistor, which is arranged between wiring for connecting an output of the second non-volatile memory and a downstream one of the first inverter and the second inverter, and one of VSS and VDD,
wherein the drain of each of the first non-volatile memory and the second non-volatile memory is connectable to the one of VSS and VDD via the transistor.

5. A semiconductor memory circuit according to claim 1, further comprising a capacitor arranged between the input of at least one of the first inverter and the second inverter, and one of VSS and VDD.

6. A semiconductor memory circuit according to claim 1, further comprising a PN junction in a reverse direction, which is arranged between the input of at least one of the first inverter and the second inverter, and one of VSS and VDD.

7. A semiconductor memory circuit according to claim 1, further comprising a resistor arranged in series to at least one of wiring on the source side and wiring on the drain side of each of the first non-volatile memory and the second non-volatile memory.

* * * * *